United States Patent [19]
Gedney et al.

[11] Patent Number: 5,483,421
[45] Date of Patent: Jan. 9, 1996

[54] IC CHIP ATTACHMENT

[75] Inventors: Ronald W. Gedney, Vestal; Tamar A. Sholtes, Endicott, both of N.Y.

[73] Assignee: International Business Machines Corporation, Armonk, N.Y.

[21] Appl. No.: 848,467

[22] Filed: Mar. 9, 1992

[51] Int. Cl.⁶ .................................................. H05K 7/02
[52] U.S. Cl. ...................... 361/771; 174/255; 174/258; 174/260; 174/261; 361/767; 361/770; 361/792; 361/795
[58] Field of Search .................................. 174/255, 260, 174/262, 263, 256, 257, 258, 261; 257/777, 778, 782, 393, 723, 724, 702; 361/400, 405, 406, 411, 412, 396, 414, 417, 748, 750, 751, 760, 767, 770

[56] References Cited

U.S. PATENT DOCUMENTS

| | | | |
|---|---|---|---|
| 4,034,468 | 7/1977 | Koopman | 174/262 |
| 4,202,007 | 5/1980 | Dougherty et al. | 257/778 |
| 4,415,025 | 11/1983 | Horvath | 361/386 |
| 4,448,306 | 5/1984 | Sinnadurai et al. | 206/334 |
| 4,595,096 | 6/1986 | Sinnadurai et al. | 206/334 |
| 4,682,270 | 7/1987 | Whitehead et al. | 361/400 |
| 4,724,472 | 2/1988 | Sugimoto et al. | 257/778 |
| 4,821,142 | 4/1989 | Ushifusa et al. | 361/414 |
| 4,825,284 | 4/1989 | Soga et al. | 257/778 |
| 5,065,227 | 11/1991 | Frankeny et al. | 257/778 |

FOREIGN PATENT DOCUMENTS

| | | | |
|---|---|---|---|
| 0058068 | 8/1982 | European Pat. Off. | |
| 0337686 | 10/1989 | European Pat. Off. | 361/392 |

OTHER PUBLICATIONS

IBM Technical Disclosure Bulletin, vol. 18, No. 5, pp. 1440–1441.
IBM Technical Disclosure Bulletin, vol. 20, No. 8, pp. 3090–3091.
IBM Tech. Disc. Bulletin, vol. 33, No. 2, pp. 15–16.
IBM Tech. Disc. Bulletin, vol. 10, No. 12, pp. 1977–1978.
IBM Technical Disc. Bulletin, vol. 18, No. 5, pp. 1379–1380.
Research Disc., May 1990, No. 313, Kenneth Mason Publications, Ltd.

*Primary Examiner*—Donald A. Sparks
*Attorney, Agent, or Firm*—Calfee, Halter & Griswold

[57] ABSTRACT

A package for mounting I/C chips onto a circuit board is provided. The chip has a surface array of input/output pads on one side which forms a footprint. A carrier is formed of an organic dielectric material having opposite surfaces. A first set of bonding pads is formed on one surface of the chip carrier and arranged to correspond with the chip footprint. A first set of solder ball connections connects the input/output pads on the chip to the first set of bonding pads on the chip carrier. A second set of bonding pads is formed on the other surface of the chip carrier forming a second set of bonding pads. Electrically conducting vias extend through the chip carrier connecting the first set of bonding pads to the second set of bonding pads. An organic circuit board having a coefficient of thermal expansion similar to the chip carrier having electrical connector sites is provided, the sites are arranged in a pattern corresponding to the pattern of the second bonding pads on the chip carrier. A second set of solder ball connections connect the pads of the second set of bonding pads on the chip carrier to the connection sites on the circuit board.

12 Claims, 3 Drawing Sheets

IC CHIP ATTACHMENT

FIELD OF THE INVENTION

This invention relates generally to the attachment of integrated circuit devices to printed circuit cards, and more particularly to the attachment of integrated circuit (IC) semi-conductor chips to printed circuit cards utilizing a chip carrier which has coefficient of thermal expansion (TCE) that matches the thermal coefficient of expansion of the card.

BACKGROUND ART

The packaging of integrated circuit chips for use in computers or similar devices involves the attachment of integrated circuit semiconductor chips to printed circuit boards which printed circuit boards in turn are mounted in various computers or other type devices. The circuit boards have conductors formed thereon which provide the various power, ground and I/O signal lines to the integrated circuit chips.

There have been many different prior art proposals for connecting integrated circuit chips to printed circuit boards. The very large difference in thermal coefficient of expansion (TCE) between the silicon device, i.e. the chip, and the printed circuit board generally requires some intermediate device carrier. One such type of interconnection mounts the integrated circuit chip on a ceramic chip carrier or module, which module in turn is mounted on a circuit board. There may be one or more chips mounted on each device carrier or module and there may be one or more modules mounted on any given circuit board. In a particularly well known type of configuration of such mounting, the integrated circuit chip is mounted onto a ceramic module by "flip-chip" bonding wherein the I/O pads on the face of the chip are bonded to corresponding pads on the module, such connection being formed by use of solder bumps or solder balls normally using solder reflow techniques. Such connections are often referred to as C4 connections. The ceramic module conventionally has a wiring structure either on the surface thereof or more usually on the surface and also buried therein which fans out, and vias formed of conducting material pass through the module terminating on the opposite side thereof. Conventionally, the opposite side of the module is provided with an array of pins which pins in turn are positioned to be inserted into a complementary array of holes on a circuit board. This type of mounting of a module to a card is commonly known as "pin-in-hole" mounting. Mounting of a chip to module or module to card by these types of connections is shown in U.S. Pat. No. 4,415,025 assigned to IBM. The wiring "fans out" on the lower side of the carrier to about a 0.100" grid (at the present state of technology). This is a conventional type of interconnection between integrated circuit chips and printed circuit boards using "flip-chip" or solder ball technology to mount the chip to a ceramic chip carrier and using pin-in-hole technology to mount the ceramic carrier to a printed circuit board. A variation of this type of mounting using an interposer is shown in IBM Technical Disclosure Bulletin Volume 18, Number 5, Pages 1379–1380.

While this technique for connection of chips to boards is effective in many instances, it does have several drawbacks and limitations. One very serious drawback is the differential of the expansion of the ceramic chip carrier on one hand and the glass reinforced plastic printed circuit board on the other hand when the board and chip carrier are heated. Because of this differential of expansion, stress is created at the board/module interface, which can lead to material failure. This becomes more critical for larger modules (e.g. high I/O pin count) Another draw back to this type of mounting is the spacing requirements for pin and holes (e.g. 0.100" is typical). Large through holes in the card (typically 30–40 mils) require spacings of 75–100 mils thereby necessitating a rather large area of interconnection to the circuit board even though the spacing of the I/O pads on the integrated circuit chip are relatively closely spaced. Further, the pins and holes must be precisely aligned to assure proper interconnection.

One attempt to overcome these drawbacks is the so-called direct chip attached to the circuit board. This does have many advantages. However, in addition to the thermal mis-match, it does pose certain problems, since the spacing of the interconnect pads on the chip are so very close that they require very fine line patterns on the substrate to which the chip is to be attached. For example, because of the very high density of I/O pads on chips (i.e. their very close spacing, 0.010" being typical), the line widths and corresponding spacing that is required for this mounting can be very small, the line width required in some cases being as small as 0.001 inch, or less. While it is theoretically possible to achieve this fine line size and close spacing on a card, it would be very expensive to do so, especially with the quality and process controls necessary for commercial production. Since these fine line sizes and spacings are required only in the area of chip attachment and not on the rest of the circuit board, using this technology on the entire circuit board introduces substantially extra costs, and the fine lines required introduces reliability as well as cost problems in forming these fine lines at locations on the board, especially at locations other than the chip attachment areas, where it is not necessary to do so.

There have been several different attempts to overcome the various drawbacks of the direct chip attachments and other chip attachment techniques while retaining the use of chip carriers. One such proposal is shown in U.S. Pat. No. 4,202,007 in FIG. 6 thereof wherein a ceramic chip carrier which mounts a chip is mounted to the circuit board by means of solder ball interconnections. This overcomes the problem of the large area required for the spacing of pin and hole mounting. Moreover, the use of solder ball technology allows the interconnections of the ceramic carrier to the board to be closer together. Additionally, this frees up some board wiring channels which would be blocked by pins. However, this does not overcome the problem inherent in thermal mismatch between the ceramic carrier and the circuit board, i.e. the difference in the TCE's of both materials.

Other techniques for attachment of ceramic chip carriers to glass reinforced epoxy circuit boards (FR-4) are shown in IBM Technical Disclosure Bulletin Volume 18, Number 5, Pages 1440–1441 and IBM Technical Disclosure Bulletin Volume 20, Number 8, Pages 3090–3091.

In an attempt to overcome the problem of thermal mismatch between the chip carrier and the circuit board it has been proposed to fashion the chip carrier from a material similar to that of the circuit board. Such techniques are described in IBM Technical Disclosure Bulletin Volume 33, Number 2, Pages 15–16 and IBM Technical Disclosure Bulletin Volume 10, Number 12, Pages 1977–1978. However, both of these references require that the connections, at least for the signal I/O lines, be on the same side of the carrier as that to which the chip is mounted (Volume 33, Number 2 does show a pin mounting of the power and ground pins from the opposite side of the carrier to the carrier). These techniques do solve the problem of thermal mismatch between the chip carrier and the circuit board, but they require peripheral I/O bonding and an additional interposer between the chip and the chip carrier. IBM Technical Disclosure Bulletin Vol. 10, No. 12, requires peripheral attachment of the chip to an interposer (carrier 2) which is bonded to the chip carrier and then attached to the card. This peripheral bonding on the chip limits the I/O which can be placed on a small chip.

IBM Technical Disclosure Bulletin Vol. 33, No. 2, requires a peripheral attach of a flexible interposer between chip carrier and card and also has size and I/O limitations.

SUMMARY OF THE INVENTION

According to the present invention, a package for mounting integrated circuit chips onto a circuit board is provided. The integrated circuit chip has a surface array of input/output pads on one side thereof which forms a footprint. A carrier is formed of an organic dielectric material having first and second opposite surfaces. A first set of bonding pads is formed on one surface of the chip carrier and arranged in an array to correspond with the chip footprint. A first set of solder ball connections connects the input/output pads on the chip to the first set of bonding pads on the chip carrier. A second set of bonding pads is formed on the second surface of the chip carrier forming a second set of bonding pads formed in an array. Electrically conducting vias extend through the chip carrier connecting the first set of bonding pads to the second set of bonding pads. A circuit board formed of an organic material having a coefficient of thermal expansion similar to the chip carrier is provided. A set of electrical connection sites are provided on the circuit board and arranged in a pattern corresponding to the pattern of the array of the second bonding pads on said chip carrier. A second set of solder ball connections connect the pads of said second set of bonding pads on the chip carrier to the connection sites on the circuit board. Preferably, the composition of the solder connecting the input/output pads on the chip to the first set of pads on the chip carrier is a higher melting solder such as 10% Sn, 90% Pb than the solder balls connecting the second set of bonding pads on the chip carrier to the chip connection sites on the circuit board which can be 60% Sn, 40% Pb.

DESCRIPTION OF THE DRAWINGS

FIG. 1 is an longitudinal sectional view on an enlarged scale from FIG. 1 of an integrated circuit chip, a chip carrier, and circuit board mounted and connected according to this invention.

DESCRIPTION OF PREFERRED EMBODIMENT

Figure 1:
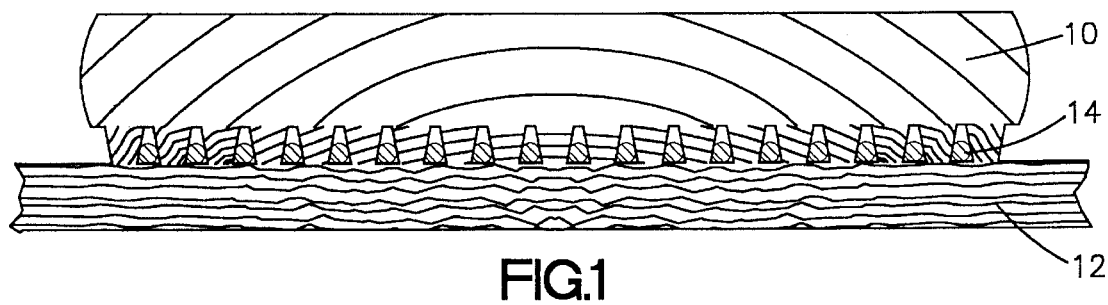
FIG. 1 is a longitudinal section view, somewhat diagrammatic, showing the connection of a ceramic chip carrier to a glass filled organic circuit board card (FR-4) by means of solder ball connections, and depicting the stress pattern generated at elevated temperature due to thermal mismatch.

Referring now to the drawing and for the present to FIG. 1, a somewhat diagrammatic or schematic representation of a ceramic chip carrier 10 mounted on a glass filled epoxy organic circuit card 12 by means of solder ball connections 14 is depicted. This type of mounting of a ceramic carrier onto an organic circuit board is representative of one prior art approach for mounting ceramic chip carriers onto a circuit card, such as depicted in FIG. 6 of U.S. Pat. No. 4,202,007. Conventionally, the circuit card is FR-4 (glass-epoxy) material and the solder balls can be any one of several types of solder (for example, 90% lead, 10% tin is often used). In this type of solder ball interconnections of materials with different coefficients of thermal expansion (TCE), such a connection between ceramic chip carrier and organic circuit boards, low cycle thermal fatigue is one of the major causes of failures. The fatigue life of the solder usually is a function of the magnitude of plastic and elastic strains in the solder. Interconnections used for high density electronic packaging are approaching smaller and smaller dimensions, and strain concentrations are frequently localized in very tiny zones with high magnitudes even though actual displacements are small. An optical method, Moire Interferometry can be used to identify and quantify macro and micro deformations and strains in solder ball interconnections.

Moire Interferometry is a whole-field optical technique that utilizes very high sensitivity and spatial resolution. With this method, a crossed-line high frequency grating is formed on the specimen surface, and it experiences the same deformation as the specimen under mechanical or thermal loading. A virtual reference grating of a given frequency is generated by coherent beams and is superimposed on the specimen grating. The fringe pattern obtained at the film plane of a camera is a contour map of in-plane displacement which is proportional to the fringe order Nx in the pattern. A contour map of a displacement field can be produced when the two coherent beams are incident in the vertical plane (y-z plane). Strains can be calculated from derivatives of the displacements U and V or can be measured directly from fringe frequencies. In this test, reference gratings of 2400 lines/mm were used, providing a sensitivity of 0.417 µm per fringe order. The spatial resolution is about 10 µm which is sufficient for measuring strain distributions in an individual solder ball connection of a ceramic chip carrier to a glass reinforced plastic circuit OR board known as FR-4.

Specimen and Experimental Procedure

The specimen was a 25 mm module cut from a ceramic chip carrier FR-4 card solder ball connection. The cross-section of the module with the card connected by solder balls was ground to a flat surface which contained all components. A specimen grating was formed at an elevated temperature about 60° C. above ambient and allowed to cool and then measured at ambient temperature. The frequency changes of the specimen grating represented deformations experienced by the specimen under the thermal loading.

In order to put known-frequency gratings on the specimens, a ULE (ultra-low expansion glass) grating mold was first produced, and then specimen gratings were formed from the ULE grating. Special procedures applied in this work to produce specimen grating included: (a) vacuum evaporating two aluminum coatings on an epoxy ULE grating mold; and (b) using a very thin layer of adhesive (epoxy) to transfer one of the aluminum coatings to the specimen in an oven with an elevated temperature of 82° C. The specimen and the ULE grating were maintained at the temperature constantly until the adhesive was cured. By separating the specimen from the ULE mold, one of the aluminum coatings was transferred to the specimen surface with a phase grating on it. The specimen was then cooled to the room temperature (22° C.), and measurements were conducted.

A Moire Interferometry system was built to obtain both U and V displacement fields. Frequencies of virtual reference gratings were set to match the frequencies of ULE gratings which were used to form specimen gratings. The specimen was installed on a fixture on which rigid-body rotations could be introduced. By adjusting the rotation, specimen gratings were aligned with virtual reference gratings, and pictures of fringe patterns were recorded.

Results and Analysis

Macro Deformations and Average Strains in Solder Balls

The macro deformations were driven by a global CTE mismatch which is defined as the CTE mismatch between the card and the chip carrier. The resulting strains in solder balls are referred to as a global effect.

Fringe patterns of U and V fields of a SBC cross-section are shown in FIG. 1. These are contour maps of displacements in the x and y directions, and generated by a temperature change of 60° C. by cooling. During the temperature change, the module remained almost flat, and the relative displacement in the y direction between the card and the module was basically equal to the deflection of the card. The relative displacement is plotted in FIG. 2, where the positions of solder balls are used as the distance on the x axis. The curve shows that the card was deflected into a W shape under the thermal loading. The average normal strain in each solder ball can be calculated by dividing the deflection of the card by the height of the solder balls. The strain values are given as one of the vertical axes, and the values which are normalized to an equivalent CTE unit (ppm/°C.) using a temperature change $\Delta T = -60°$ C. are also shown.

Figure 2:
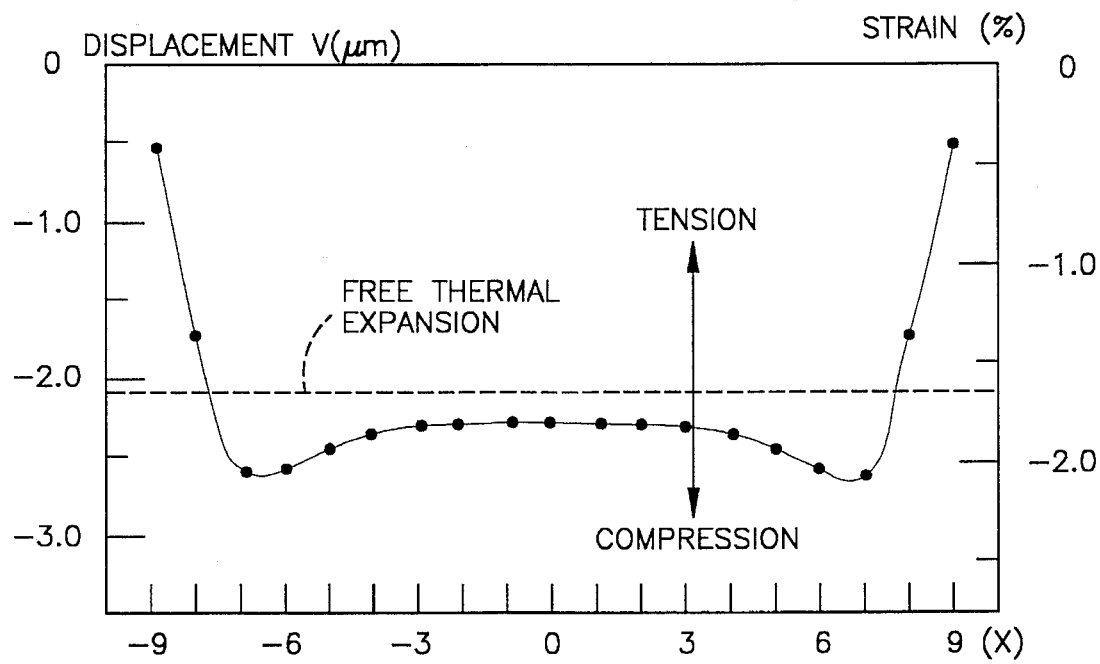
FIG. 2 is a graph plotted to depict the relative deformation of a circuit board card and ceramic module under thermal stress showing the average normal strain in each solder ball connection.

It is important to note that the strain values are the total strains which include two parts, the thermal strain from a free expansion and the mechanical strain from mechanical constraints. The value of free thermal expansion of the solder, shown as the dashed line in FIG. 2, is 28 ppm/°C. which is corresponding to $-0.17\%$ strain for a $\Delta T = -60°$ C. The mechanical strain is equal to the difference between the total strain (solid curve) and the free thermal expansion. As the assembly cools down, the middle solder balls are under compression and the two solder balls at each end are under tension. Strain signs are reversed if the temperature is increasing.

Figure 3:
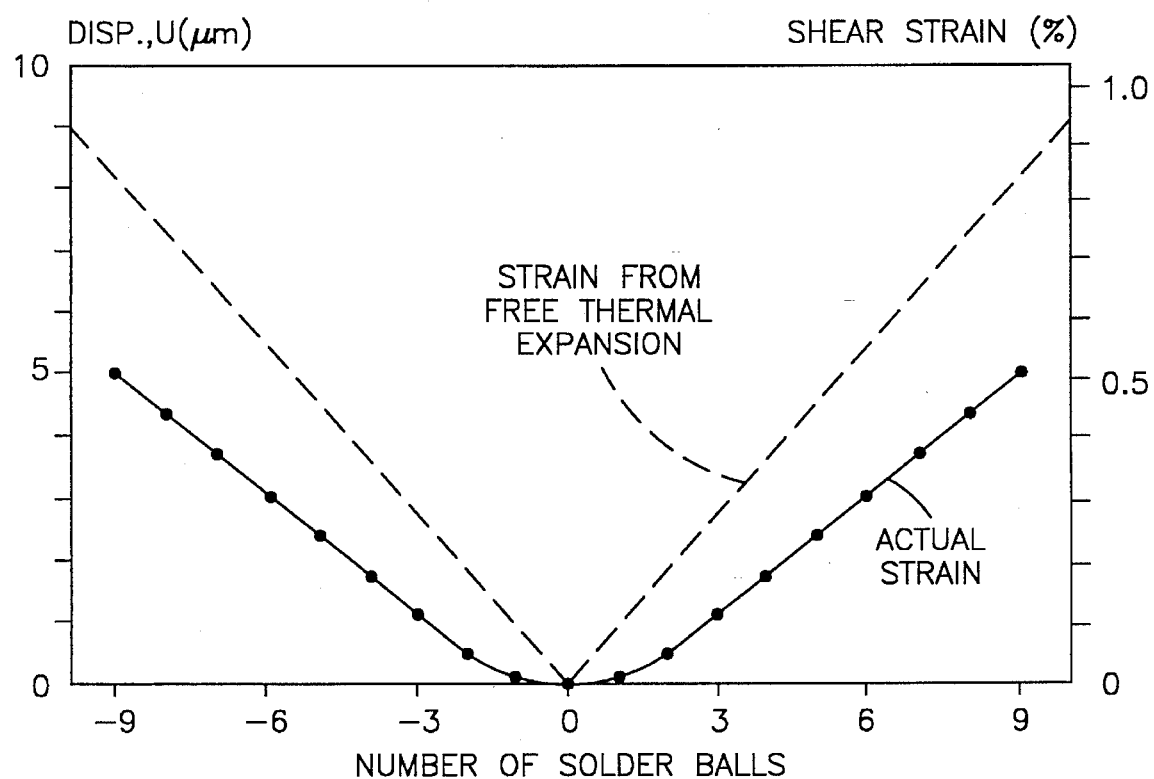
FIG. 3 is a graph showing the relative shear displacement between a circuit board and a ceramic module showing strain in the planar direction between the board and module and the average shear strain in each solder ball.

During the cooling process, the card shrank more than the module due to the CTE difference. The relative shear displacement in the x direction between the inner surfaces of the card and the module is shown in FIG. 3. At the end of the module, the card was actually moved inward relative to the module by about 5 µm, and generated an average shear strain of 0.52% in the end solder balls where the global distance to neutral point DNP were the greatest (the global DNP is the DNP of the assembly). The shear strain values for solder balls of lower global DNP can also be obtained from FIG. 3.

Assuming the solder balls were totally relaxed i.e., the strains are purely plastic, and the card and the module deformed freely without mechanical constraint between each other, the relative displacement would take the value as shown by the dashed line. The difference in these two curves (solid and dashed) shows that both elastic and plastic strains existed in the solder balls. The assembly was mechanically constrained by the remaining shear strength in the solder.

To summarize, FIG. 1 shows a series of fringes or line patterns which are depictions of characteristic strains induced due to thermal mismatch between the ceramic carrier and the organic card when cooled from an elevated temperature (such as a system "on" condition to a system "off" condition) and measured by Moire laser Interferometry. This figure demonstrates how the thermal mismatch induces significant strain upon heating and cooling of the card and chip carrier assembly which will occur during operation of most circuit boards.

FIG. 2 shows the pattern of relative normal displacement between the card and the chip carrier, which describes the deflection of the card and the resulting strain in each solder ball under the same 60° C. temperature change. FIG. 3 shows the stress in the plane of the module.

From an examination of FIGS. 1, 2 and 3, it can be seen that when a ceramic carrier is attached to an organic circuit board and the temperature of the structure is changed, a significant amount of stress is introduced into the unit. This stress is carried by or impressed upon the solder ball connection. Hence, in order to resist this stress, i.e. to prevent failure of the unit at the solder ball joints 14 or at their connection to the bonding pads on the chip or carrier, the solder balls have to be of sufficient size and strength and the bonds to the pads sufficiently strong or reinforced to withstand the strain without failure. Thus, the solder balls need to act not only as an electrical connector for the chip carrier and circuit board in the relaxed or unstrained condition, they must also act as mechanical structural elements that are "plastic" in nature to prevent the induced differential expansion movement of the card and the chip carrier transmitting sufficient stress to cause failure of the structure.

Figure 5:
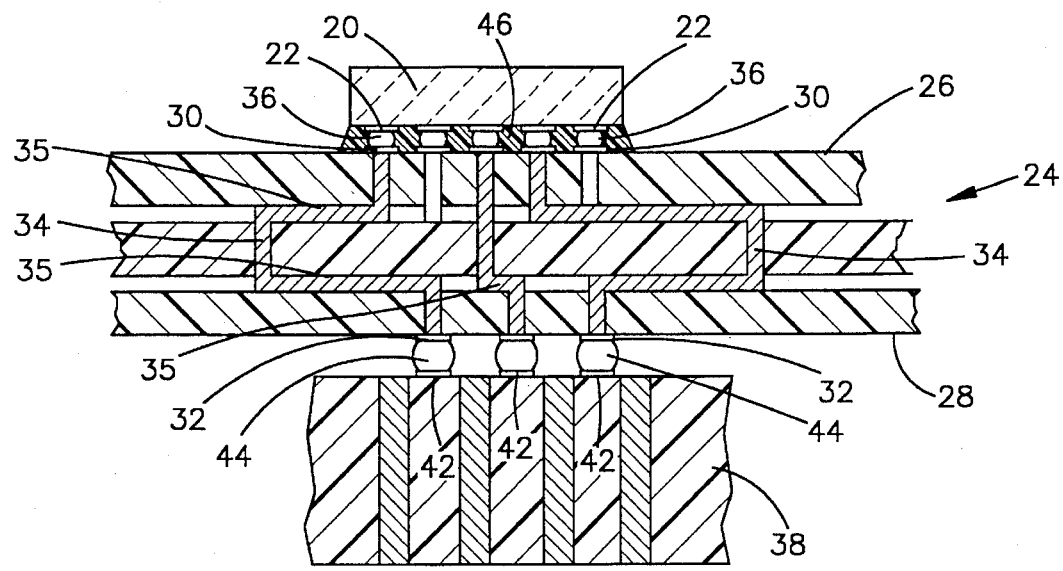
Figure 4:
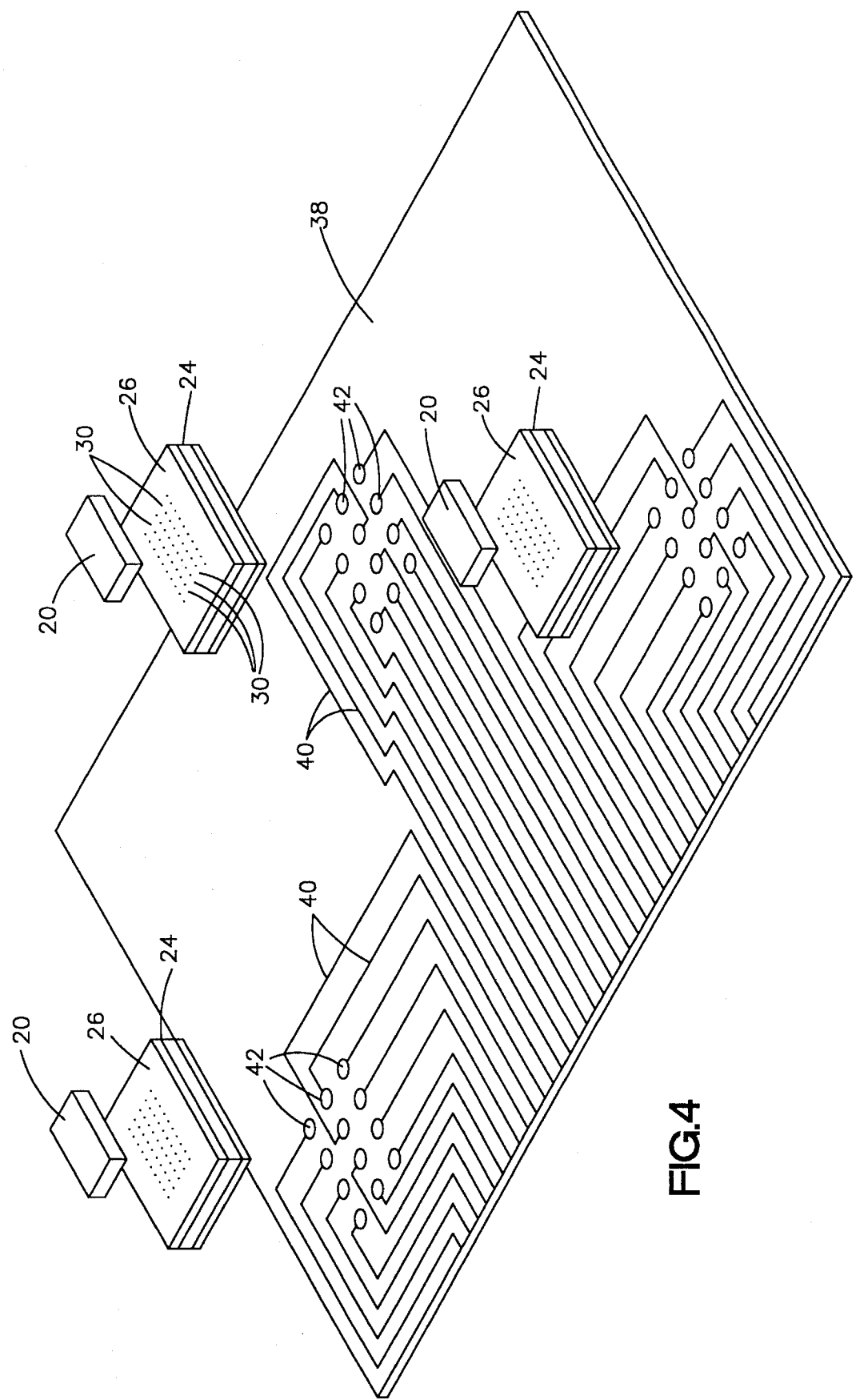
FIG. 4 is an exploded perspective view showing the mounting of chips onto a carrier and carrier onto a circuit card according to the present invention.

A structure to minimize and, in fact, essentially eliminate any thermal stress due to different coefficients of thermal expansion between the chip carrier and the circuit board is shown in FIGS. 4 and 5. According to the present invention, a conventional integrated circuit chip 20 is provided which has an array of input/output pads 22 on one side thereof which provides not only input/output signal connections to and from the chip but also power and ground connections. This array is commonly referred to as a chip "foot print". With presently available circuit technology, the input/output pads can be as close together as 0.008" with 0.010" being typical in an area array pattern.

A chip carrier 24 is provided which has a top surface 26 and a bottom surface 28. (The term "top" and "bottom" are used only to differentiate between the two surfaces, and do not specifically refer to the orientation of the chip or carrier when the structure is mounted on the card, or when the card is mounted in a machine.) The top surface 26 of the chip carrier 24 has an array of bonding pads 30 which are arranged in a pattern which pattern corresponds to the pattern or foot print of the I/O pads 22 on the chip 20. The bottom surface 28 of the chip carrier 24 has a second set of bonding pads 32 which are connected to the set of bonding pads 30 by metal plated vias 34. There can be several layers of material forming the chip carrier with lines 35 formed between each layer and vias interconnecting the various metal layers, as depicted; or the chip carrier can be a single layer. Whether the carrier is a single layer or formed of multiple layers is unimportant for the purpose of this invention.

Since the chip carrier 24 is larger than the chip 20, the spacing between the bonding pads 32 on the bottom surface 28 can be and normally is larger than the spacing between the bonding pads 30 on the top surface 26 (which spacing, as indicated above, is dictated by the spacing of the I/O pads 22 on the chip 20). This is referred to as a fan-out pattern.

The spacing of the bonding pads 32 is typically 0.050". This is a smaller distance than required for pins, but large enough not to require fine lines (i.e. 0.001 inch) to be formed on the board, which can be expensive, and difficult to achieve over the entire surface of the board, including much of the area where it is not required all as described above.

In the present invention, the chip carrier 24 preferably is made of the same material as the circuit board, as will be described presently. If the chip carrier is not fashioned from the same material as the board, it must, in any event, have a similar coefficient of thermal expansion; i.e. the difference in the coefficient of thermal expansion between the carrier and the circuit board should not vary more than about 20%. The chip carrier and board are made from an organic dielectric material. In the preferred embodiment, the chip carrier and the board are both made of the above noted glass filled epoxy FR-4 material which has a thermal coefficient of expansion of about $17-20\times10^{-6}$ ppm/C.

The preferred method of manufacturing the chip carrier is in a large panel format. The panel, after processing, can then be cut into smaller segments. Thus productivity is enhanced by processing large pieces such that defects in one small area of the panel only affect one or a few of the many small complex pieces produced, rather than the whole card. This enhances yield. Generally the necessary surface wiring and vias are formed during the large panel fabrication. But state-of-the-art panel facilities are capable of producing only 0.005" lines and spaces, which are inadequate for fan-out wiring of a complex semiconductor device.

The fine line technology required can be produced one of two ways. Additive plating techniques on a large panel utilizing flash copper, thin resists, and plating up half ounce copper lines, then etching the flash copper can produce the fine lines needed for wiring to the semiconductor device (0.001" to 0.003"). The large panel is then cut up into smaller pieces as required for the application. Alternatively, the vias and intermediate layers can be produced in a standard panel manufacturing facility. The panels are constructed with one half ounce copper on the external planes (one ounce copper is standard). They are then cut or formed into individual chip carriers. These chip carriers are then processed in a ceramic module photo-etch line which is capable of forming line widths and spaces of less than 0.001" and 0.002", respectively.

The chip 20 is mounted to the chip carrier 24 by means of solder balls 36 which interconnect the I/O pads 22 on the chip 20 to the bonding pads 30 on the top surface 26 of the chip carrier 24. Any conventional solder can be used. However, in the preferred embodiment, it is preferable to use a solder on the chip having a higher melting point than the solder which connects the chip carrier to the board as will be explained presently. One such solder is 90% Pb, 10% Sn. Alternatively, low melting point (e.g. about 140° C. to 180° C.) solders such as various lead-indium solders can be used.

A circuit board 38 is provided which is preferably formed of the same material as the chip carrier 24 or at least formed of a material that has a similar coefficient of thermal expansion as described above. As indicated above, the preferred material is an epoxy glass combination usually known in industry as FR-4; but other materials such as polyimides which have similar properties can be used. Electrical conducting lines 40 are provided on the surface of the board with bonding sites 42 formed in an array to correspond to the bonding pads 32 on the bottom surface 28 of the chip carrier 24.

The bonding pads 32 are then bonded to the bonding sites 42 by means of solder balls 44. The solder balls 44 can be any solder material. However, it is preferred that the solder balls 44 be of a low melt solder such as tin-lead eutectic (63% Sn, 37% Pb). If the melting point of this solder is lower than the solder joining the chip to the chip carrier, then that joint will not have to reflow a second time. However, it should be noted that experience shows that a second melting of the chip joint is not detrimental to the reliability of the package; nor will the device or interconnection be disturbed during normal processing.

An encapsulation material 46, such as a quartz filled epoxy of the type described in U.S. Pat. No. 4,825,284 can be used to protect and strengthen the solder connections between the device 20 and carrier 24. The chip and carrier can also be thermally enhanced similar to techniques described in U.S. Pat. No. 4,034,468.

By use of solder ball mounted chip carriers having a CTE matched to the board, several significant advantages are achieved over the use of ceramic carriers. These advantages include the ability to utilize relatively large chip carriers, if desired. However, by utilizing the via grid of printed wiring boards (typically 0.050"), a chip carrier with 600+I/O's can be only 36 mm square. Further, in the absence of thermal mismatch, the size of the solder balls 44 can be selected principally on current carrying requirements, not on structural strength requirements, and thus can be appreciably smaller. Smaller solder balls can be placed closer together, further shrinking the attainable pitch and carrier size.

Thus, the present invention describes a structure and method for producing the same having fine line fan-out patterns on chip carriers which match the thermal coefficient of expansion of circuit boards. Since the line pattern for bonding the chip to the carrier can be much finer than that for bonding the carrier to the board, such chip carriers can accommodate chips having many input/output pads with very close spacing. The chip carriers or modules can be attached to the circuit board with very small solder balls allowing minimal spacing of the attachment pads on the carrier. Moreover, the chip carrier or module can have a very high number of input/output connections as they are not limited in size by thermal mismatch considerations. Additionally, the small solder balls allow a finer input/output grid to be achieved (e.g. 0.020") which provides for a very high number of interconnections on a reasonably small carrier (e.g. 2500 I/O's on a 1.00" square carrier).

Although several embodiments of this invention have been shown and described, various adaptations and modifications can be made without departing from the scope of the invention as defined in the appended claims.

Having thus described the preferred embodiment, the invention is now claimed to be:

1. A package mounting integrated circuit chips onto a circuit board comprising:

an integrated circuit chip having a surface array of input/output pads on one side thereof which array forms a footprint;

a chip carrier formed of an organic glass filled epoxy dielectric material having first and second opposite surfaces;

said chip carrier having a coefficient of thermal expansion of at least $17\times10^{-6}$ ppm/c°;

a first set of bonding pads formed on said first surface of the chip carrier and arranged in an array corresponding with the chip footprint;

a pattern of conductors on said chip carrier connected to accommodate said input/output pads;

a first set of solder connections interconnecting the input/output pads on the chip to said first set of bonding pads on the chip carrier;

an encapsulation material encapsulating said first set of solder connections;

a second set of bonding pads formed on the second surface of the chip carrier arranged in an array;

electrically conducting vias extend through the chip carrier connecting said first set of bonding pads to the second set of bonding pads;

a circuit board formed of an organic material having a coefficient of thermal expansion similar to the chip carrier;

a set of electrical connection sites formed on said circuit board and arranged in a pattern corresponding to the pattern of the array of the second bonding pads on said chip carrier;

a second set of solder connections interconnecting the pads of said second set of bonding pads on the chip carrier to the connection sites on the circuit board; and wiring on said circuit board connected to said second set of bonding pads.

2. The package of claim 1 wherein said chip carrier and said circuit board are formed of the same material.

3. The package as defined in claim 1 wherein said first set of solder connections is formed of a higher melting point solder than said second set of solder connections.

4. The package as defined in claim 1 further characterized by first bonding pads being more closely spaced to each other than said second bonding pads.

5. The package as defined in claim 1 wherein the thermal coefficient of expansions of the material of the chip carrier and the material of the circuit board do not differ by more than about 20%.

6. The package as defined in claim 1 wherein the thickness of the conductors on said chip carrier is thinner than the wires of the wiring on the circuit board.

7. A method of mounting integrated circuit chips onto a circuit board comprising the steps of:

providing an integrated circuit chip having a surface array of input/output pads on one side thereof which array forms a footprint;

providing a chip carrier formed of an organic glass filled epoxy dielectric material having first and second opposite surfaces;

said chip carrier having a coefficient of thermal expansion of at least $17 \times 10^{-6}$ ppm/c°;

forming a first set of bonding pads on said first surface of the chip carrier arranged in an array corresponding with the chip footprint;

providing a pattern of conductors on said chip carrier connected to accommodate said input/output pads;

forming a first set of solder connections between the input/output pads on the chip and said first set of bonding pads on the chip carrier;

an encapsulation material encapsulating said first set of solder connections;

forming a second set of bonding pads on the second surface of the chip carrier arranged in an array;

forming electrically conducting vias through the chip carrier to connect said first set of bonding pads to the second set of bonding pads;

providing a circuit board formed of an organic material having a coefficient of thermal expansion similar to the chip carrier;

forming a set of electrical connection sites on said circuit board arranged in a pattern corresponding to the pattern of the array of the second bonding pads on said chip carrier;

forming a second set of solder connections between the pads of said second set of bonding pads on the chip carrier and the connection sites on the circuit board; and forming wiring on said circuit board connected to said second set of bonding pads.

8. The method of claim 7 wherein said chip carrier and said circuit board are formed of the same material.

9. The method as defined in claim 7 wherein said first set of solder connections is formed of a higher melting point solder than said second set of solder connections.

10. The method as defined in claim 7 further characterized by first bonding pads being more closely spaced to each other than said second bonding pads.

11. The method as defined in claim 7 wherein the thermal coefficient of expansions of the material of the chip carrier and the material of the circuit board do not differ by more than about 20%.

12. The package as defined in claim 7 wherein the thickness of the conductors on said chip carrier is thinner than the wires of the wiring on the circuit board.

* * * * *